United States Patent
Lee et al.

(10) Patent No.: US 10,102,136 B2
(45) Date of Patent: Oct. 16, 2018

(54) ELECTRONIC DEVICE AND METHOD FOR FABRICATING THE SAME

(71) Applicant: Sk hynix Inc., Icheon-Si (KR)

(72) Inventors: Hyung-Suk Lee, Icheon-si (KR); Jung-Hyun Kang, Icheon-Si (KR); Sang-Soo Kim, Icheon-Si (KR)

(73) Assignee: SK hynix Inc., Icheon-si (KR)

(*) Notice: Subject to any disclaimer, the term of this patent is extended or adjusted under 35 U.S.C. 154(b) by 97 days.

(21) Appl. No.: 14/793,614

(22) Filed: Jul. 7, 2015

(65) Prior Publication Data

US 2016/0181315 A1 Jun. 23, 2016

(30) Foreign Application Priority Data

Dec. 17, 2014 (KR) .................. 10-2014-0182675

(51) Int. Cl.
*G06F 12/0875* (2016.01)
*H01L 43/02* (2006.01)
*H01L 43/08* (2006.01)

(52) U.S. Cl.
CPC .......... *G06F 12/0875* (2013.01); *H01L 43/02* (2013.01); *H01L 43/08* (2013.01); *G06F 2212/452* (2013.01)

(58) Field of Classification Search
CPC ............ G11C 11/1673; G11C 11/1675; G11C 13/0007; G11C 13/0069
(Continued)

(56) References Cited

U.S. PATENT DOCUMENTS

2004/0179393 A1* 9/2004 Yoda .................. G11C 11/15
                                                                      365/158
2007/0246787 A1* 10/2007 Wang ..................... H01L 43/08
                                                                      257/421
(Continued)

FOREIGN PATENT DOCUMENTS

KR 10-2003-0002884 A 1/2003
KR 10-0550639 B1 2/2006
(Continued)

OTHER PUBLICATIONS

Titanuim Alloy Guede. RMI Titanium Company an RTI International Metals, Inc. Company. Copyright 2000 all rights reserved. Jan. 2000.*
(Continued)

*Primary Examiner* — Huan Hoang
*Assistant Examiner* — Minh Dinh
(74) *Attorney, Agent, or Firm* — Perkins Coie LLP

(57) ABSTRACT

Provided is an electronic device including a semiconductor memory. The semiconductor memory may include: a substrate including a first region and a second region separated from the first region; an interlayer dielectric layer formed over the substrate including first and second regions; a first contact plug located over the first region and formed through the interlayer dielectric layer; a second contact plug located over the second region and formed through the interlayer dielectric layer, wherein the first and the second contact plugs having different structures in the first and second regions, respectively; and a variable resistance element formed over the interlayer dielectric layer over the first region so as to be in contact with the first contact plug.

16 Claims, 9 Drawing Sheets

(58) Field of Classification Search
USPC .......................................................... 365/148
See application file for complete search history.

(56)  References Cited

U.S. PATENT DOCUMENTS

| | | | | |
|---|---|---|---|---|
| 2013/0015541 | A1* | 1/2013 | Kanaya | H01L 43/08 |
| | | | | 257/421 |
| 2013/0099337 | A1* | 4/2013 | Nakayama | H01L 43/08 |
| | | | | 257/421 |
| 2014/0244945 | A1* | 8/2014 | Kim | G11C 13/004 |
| | | | | 711/147 |
| 2016/0027843 | A1* | 1/2016 | Kumura | H01L 27/228 |
| | | | | 257/295 |

FOREIGN PATENT DOCUMENTS

| | | |
|---|---|---|
| KR | 10-0945225 B1 | 2/2010 |
| KR | 10-2014-0022245 A | 2/2014 |

OTHER PUBLICATIONS

Titanum Alloy Guede. RMI Titanum Company an RTI International Metals, Inc. Company. Copyright 2000 all rights reserved. Jan. 2000.*

* cited by examiner

ELECTRONIC DEVICE AND METHOD FOR FABRICATING THE SAME

CROSS-REFERENCE TO RELATED APPLICATIONS

This patent document claims priority and benefits of Korean Patent Application No. 10-2014-0182675, entitled "ELECTRONIC DEVICE AND METHOD FOR FABRICATING THE SAME" and filed on Dec. 17, 2014, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a semiconductor memory capable of improving the characteristic of a variable resistance element.

In an implementation, there is provided an electronic device including a semiconductor memory. The semiconductor memory may include: a substrate including a first region and a second region separated from the first region; an interlayer dielectric layer formed over the substrate including first and second regions; a first contact plug located over the first region and formed through the interlayer dielectric layer; a second contact plug located over the second region and formed through the interlayer dielectric layer, wherein the first and the second contact plugs have different structures in the first and second regions, respectively; and a variable resistance element formed over the interlayer dielectric layer over the first region so as to be in contact with the first contact plug.

Implementations of the above electronic device may include one or more the following.

The first contact plug includes first and second materials that are different from each other, and the second contact plug has a material composition that is different from the first contact plug and includes the first material. Each of the first and second materials includes a conductive material. Each of the first and second materials includes a metallic material. The first material comprises a material which is more easily oxidized than the second material. The second material has lower specific resistance than the first material. The first material comprises a titanium material, and the second material comprises a tantalum material. The electronic device may further comprising a conductive line formed over the variable resistance element of the first region and a third contact plug formed to couple the conductive line and the variable resistance element. The electronic device may further comprising a metal wiring formed over the second contact of the second region and a fourth contact plug formed to couple the metal wiring and the second contact plug.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect, there is provided an electronic device including a semiconductor memory including a plurality of unit cells. Each unit cell of the semiconductor memory may include: a substrate including a first region and a second region that are separated from each other; a first contact plug located over the first region and having a stack structure including a first material and a second material different from the first material; a second contact plug located over the second region and including the first material, wherein the first material is more easily oxidized than the second material; a variable resistance element formed over the first contact plug to be in contact with the second material of the first contact plug, the variable resistance element structured to have different resistance states for storing information; a third contact plug formed over the variable resistance element to provide an electrical path to a conductive line; and a fourth contact plug formed over the second contact plug to be in contact with the second contact plug and including the same material as the second contact plug to reduce an interfacial resistance between the second and the fourth contact plugs.

Implementations of the above method may include one or more of the following.

The first material has an insulation property when reacted to oxygen. The second material has lower specific resistance than the first material.

In another aspect, a method for fabricating an electronic device including a semiconductor memory is provided. The method comprises: providing a substrate that includes a first region and a second region that are separated from each other; forming an interlayer dielectric layer over the substrate including first and second regions; forming a first contact plug over the first region and a second contact plug over the second region through the interlayer dielectric layer; and forming a variable resistance element over the interlayer dielectric layer of the first region so as to be in contact with the first contact plug, wherein the first contact plug includes a first material and a second material having lower specific resistance than the first material and the second material is located to be contact with the variable resistance element to reduce interfacial resistance between the first contact plug and the variable resistance element.

Implementations of the above method may include one or more of the following.

The forming of the first contact plug over the first region and the second contact plug over the second region comprises: forming first and second contact holes through the interlayer dielectric layer over the first and second regions, respectively; filling the first and second contact holes with the first material; forming a mask pattern over the interlayer dielectric layer over the second region; patterning a portion of the first material of the first region by a predetermined thickness; removing the mask pattern; forming a second material in the first and second regions; and patterning the first material and the second material in the first and second regions. The first and second materials comprise a conductive material. The first material comprises a material which is more easily oxidized than the second material. The first material comprises a titanium material, and the second material comprises a tantalum material. The patterning of the portion of the first material including etching the portion of the first material such that the top surface of the first material in the first region is positioned below the interlayer dielectric layer. The forming of the first contact plug over the first region and the second contact plug over the second region includes performing a planarization process.

DETAILED DESCRIPTION

Figure 1:
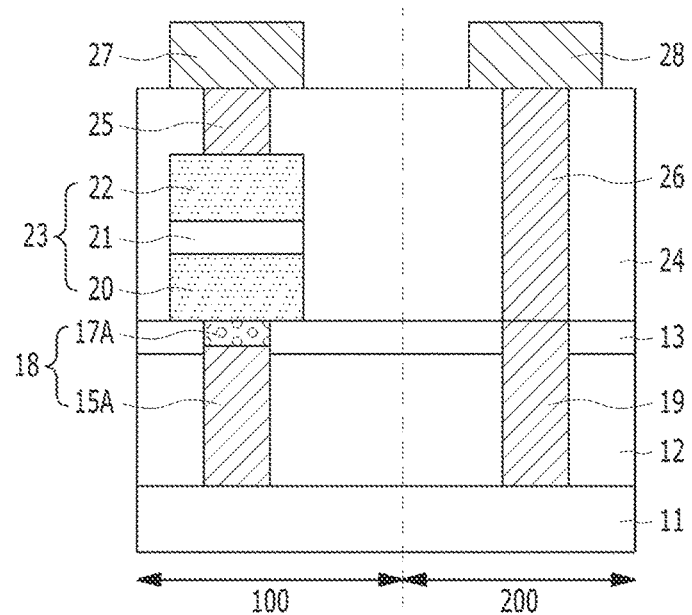
FIG. 1 is a cross-sectional view of an exemplary semiconductor device in accordance with an implementation.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view of an exemplary semiconductor device in accordance with an implementation.

As illustrated in FIG. 1, an isolation layer (not illustrated) may be formed in a semiconductor substrate 11 including a first region 100 and a second region 200. The first region 100 may include a cell region, and the second region 200 may include a peripheral region. Furthermore, a switching element (not illustrated) may be formed in a semiconductor substrate 11 of the first region 100. A first interlayer dielectric layer 12 may be formed over the semiconductor substrate 11. A hard mask layer 13 may be further formed over the first interlayer dielectric layer 12.

Furthermore, first and second contact plugs 18 and 19 having different structures from each other may be formed through the first interlayer dielectric layer 12 and the hard mask layer 13 of the first and second regions 100 and 200, respectively.

A variable resistance element 23 may be formed over the hard mask layer 13 of the first region including the first contact plug 18. Furthermore, a second interlayer dielectric layer 24 may be formed to fill the space between the variable resistance elements 23. A conductive line 27 may be formed over the second interlayer dielectric layer 24 of the first region, and a metal wiring 28 may be formed over the second interlayer dielectric layer 24 of the second region. Furthermore, a third contact plug 25 may be formed to electrically couple the variable resistance element 23 to the conductive line 27 through the second interlayer dielectric layer 24 of the first region, and a fourth contact plug 26 may be formed to electrically couple the metal wiring 28 to the second contact plug 19 through the second interlayer dielectric layer 24 of the second region.

In the present implementation, the first and second contact plugs 18 and 19 may be formed in the first and second regions 100 and 200, respectively, and may have different structures such as their materials or material compositions. The first contact plug 18 may serve as a bottom electrode contact (BEC) of the variable resistance element 23.

In implementations, the first contact plug 18 and the second contact plug 19 can be structured to have different material compositions from each other. For example, the first contact plug 18 may include a first material 15A and a second material 17A, and the second contact plug 19 may include the first material. The first and second materials may include conductive materials and are electrically conductive. For example, the first and second materials may include a metallic material. In some implementations, the first material may include a material which is more easily oxidized than the second material. As a specific example, the first material may include a titanium material, and the second material may include a tantalum material. The first contact plug 18 may have a stacked structure of the first material 15A and the second material 17A having lower specific resistance than the first material 15A, and thus reduce interfacial resistance with the variable resistance element 23. The second contact plug 19 may be formed of or include the same material as the fourth contact plug 26, and thus minimize interfacial resistance between materials.

The switching element may serve to select a specific unit cell in a semiconductor device including a plurality of unit cells. The switching element may be arranged at each unit cell, and include a transistor, or a diode and the like. The switching element may have one terminal electrically coupled to the first contact plug 18 and the other terminal electrically coupled to a source line (not illustrated).

The first and second interlayer dielectric layers 12 and 24 may include an insulating material. For example, the first and second interlayer dielectric layers 12 and 24 may include oxide, nitride, or oxynitride. The hard mask layer 13 may define a contact region for forming the first and second contact plugs 18 and 19. The hard mask layer 13 may serve as an etch barrier when the first interlayer dielectric layer 12 is etched, and include a material having an etching selectivity with respect to the first interlayer dielectric layer 12. The hard mask layer 13 may include an insulating material. For example, the hard mask layer 13 may include oxide, nitride, or oxynitride.

The variable resistance element 23 may include an MTJ (Magnetic Tunnel Junction) structure and a plurality of layers for various uses. The MTJ structure may include two magnetic layers 20 and 22 and a tunnel barrier layer 21 interposed there between. In some implementations, the variable resistance element may include a plurality of layers arranged over or under the MTJ structure. The plurality of layers in the variable resistance element 23 can be used in various manners and for various uses. For example, the plurality of layers may function to improve the characteristic of the variable resistance element 23 or facilitate the process.

The variable resistance element 23 may switch between different resistance states according to the magnetization directions of the two magnetic layers 20 and 22. For example, when the magnetization directions of the two magnetic layers 20 and 22 are equal to each other (or parallel to each other), the variable resistance element 23 may have a low resistance state, and when the magnetization directions of the two magnetic layers 20 and 22 are different from each other (or anti-parallel to each other), the variable resistance element 23 may have a high resistance state.

Any one of the first and second magnetic layers 20 and 22 may include a pinned ferromagnetic layer of which the magnetization direction is pinned, and the other one may include a free ferromagnetic layer of which the magnetization direction is changed according to the direction of a current applied to the variable resistance element 23. The first and second magnetic layers 20 and 22 may include a ferromagnetic material. For example, the ferromagnetic material may have a single-layer or multilayer structure including Fe—Pt alloy, Fe—Pd alloy, Co—Pd alloy, Co—Pt alloy, Fe—Ni—Pt alloy, Co—Fe—Pt alloy, or Co—Ni—Pt alloy, and include an impurity such as boron (B). However, other implementations are also possible regarding materials of the first and second magnetic layers.

The tunnel barrier layer 21 may change the magnetization direction of the free ferromagnetic layer through electron tunneling. The tunnel barrier layer 21 may have a single-layer or multilayer structure including a dielectric material, for example, oxide such as $Al_2O_3$, MgO, CaO, SrO, TiO, VO, or NbO, but other implementations are also possible.

The third and fourth contact plugs 25 and 26, the conductive line 27, and the metal wiring 28 may include a semiconductor layer or metallic layer. The third contact plug 25 may serve as a top electrode contact (TEC) of the variable resistance element 23. FIG. 1 illustrates that the conductive line 27 and the metal wiring 28 are formed on the same line. However, the conductive line 27 and the metal wiring 28 may be formed at different levels to have a level difference depending on the process.

FIGS. 2A to 2I are cross-sectional views illustrating an example of a method for fabricating a semiconductor device in accordance with an implementation. FIGS. 2A to 2I are cross-sectional views illustrating a method for fabricating the semiconductor device of FIG. 1. In order to promote understanding, the same reference numerals as those of FIG. 1 will be used in the following descriptions.

Figure 2A:
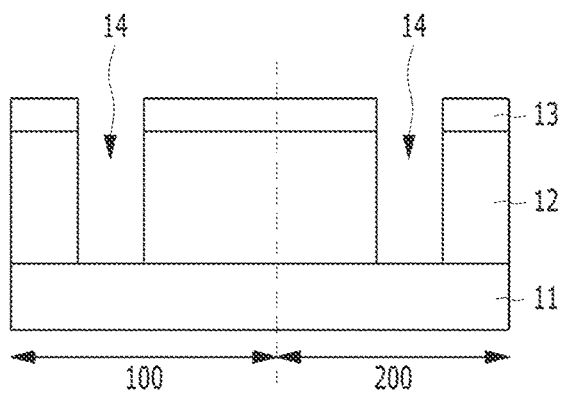
FIGS. 2A to 2I are cross-sectional views illustrating an example of a method for fabricating a semiconductor device in accordance with an implementation.

As illustrated in FIG. 2A, a first interlayer dielectric layer 12 may be formed over a semiconductor substrate 11 having first and second regions 100 and 200 formed therein. A switching element (not illustrated) may be formed in the semiconductor substrate 11 of the first region 100. The first region 100 may include a cell region, and the second region 200 may include a peripheral region. The first interlayer dielectric layer 12 may include an insulating material. The first interlayer dielectric layer 12 may include, for example, oxide, nitride, or oxynitride. The first interlayer dielectric layer 12 may include a single-layer or multilayer structure.

Then, a hard mask layer 13 may be formed over the first interlayer dielectric layer 12. The hard mask layer 13 may serve as an etch barrier when the first interlayer dielectric layer 12 is etched. The hard mask layer 13 may include a material having an etching selectivity with respect to the first interlayer dielectric layer 12. The hard mask layer 13 may include an insulating material. The hard mask layer 13 may include, for example, oxide, nitride, or oxynitride. The hard mask layer 13 may be formed with a hard mask pattern having a contact region defined therein.

Then, contact holes 14 may be formed in the first and second regions 100 and 200 by etching portions of the first interlayer dielectric layer 12 using the hard mask layer 13 as an etch barrier. The contact holes 14 may be formed to expose portions of the semiconductor substrate 11 through the first interlayer dielectric layer 12 of the first and second regions 100 and 200. The contact holes 14 may be formed to have different critical dimensions (CD) in the first and second regions 100 and 200, if necessary.

Figure 2B:
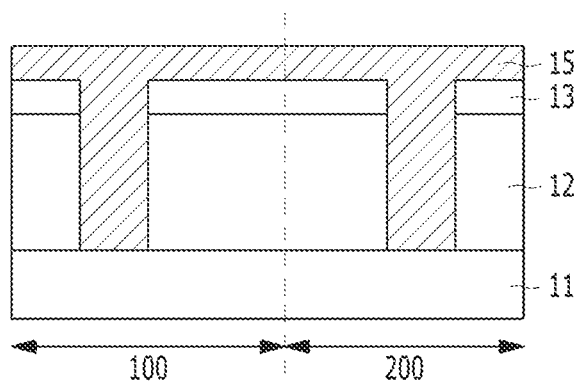

As illustrated in FIG. 2B, the contact holes 14 of the first and second regions may be filled with a first material 15. The first material 15 for forming a contact plug may include a conductive material. The first material 15 may include a metallic material. In some implementations, the first material 15 may include a material which is more easily oxidized than a second material to be formed through a subsequent process. For example, the first material 15 may include a titanium material. For example, the first material 15 may include titanium nitride.

Figure 2C:
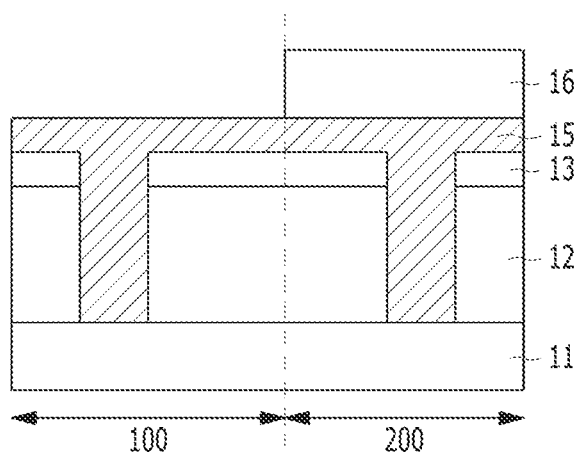

As illustrated in FIG. 2C, a mask pattern 16 may be formed over the first interlayer dielectric layer 12 of the second region 200. At this time, the first interlayer dielectric layer 12 may include the first material 15 formed over the first interlayer dielectric layer 12. The mask pattern 16 may be formed through a series of processes including coating the first material 15 with photoresist and patterning the resultant structure through exposure and development so as to expose the first material 15 of the first region 100.

Figure 2D:
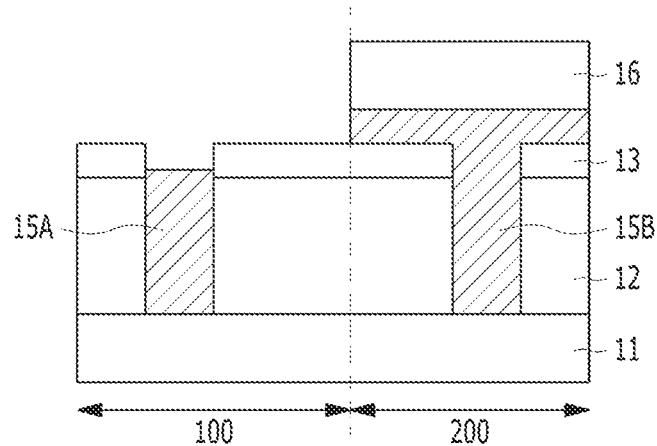

As illustrated in FIG. 2D, the first material 15 of the first region 100 may be etched to a predetermined thickness. The first material 15 may be etched to have a lower level than the top surface of the hard mask layer 13. At this time, the first material 15B of the second region 200 may be protected by the mask pattern 16, and remain without changes. The first material of the first region 100, of which the level is lowered by the etching process, will be represented by reference numeral 15A.

Figure 2E:
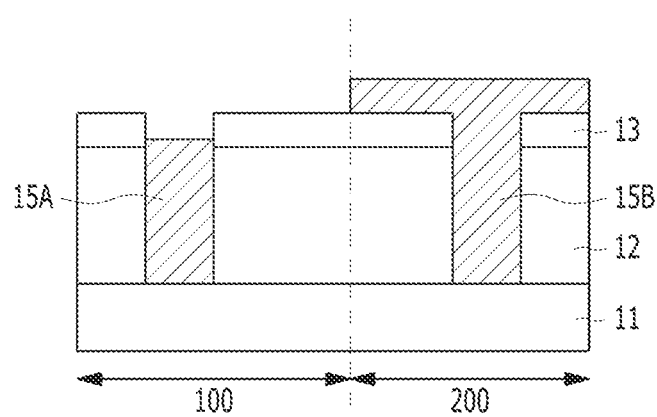

As illustrated in FIG. 2E, the mask pattern 16 may be removed. When the mask pattern 16 is or includes a photoresist layer, the mask pattern 16 may be removed through dry etching. The dry etching may be performed through an oxygen strip process, for example.

Figure 2F:
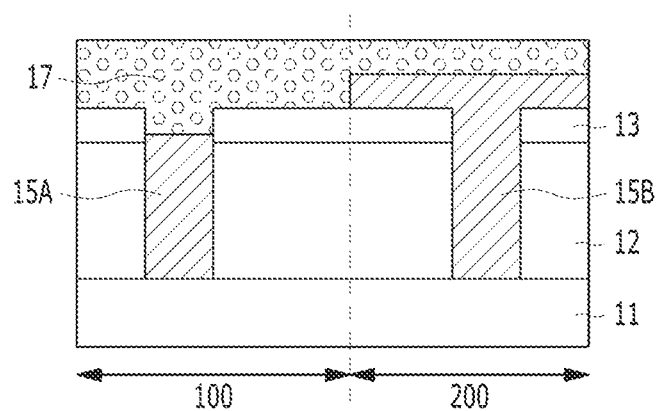

As illustrated in FIG. 2F, a second material 17 may be formed over the structure including the first materials 15A and 15B. The second material 17 may be formed to have a thickness as to completely fill the contact hole 14 of the first region. The second material 17 may include a conductive material. The second material 17 may include a metallic material. The second material 17 may include a material having lower specific resistance than the first material. For example, the second material 17 may include a tantalum material.

Figure 2G:
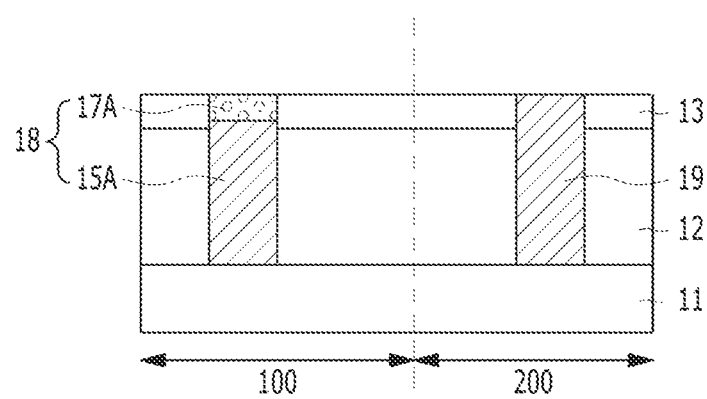

As illustrated in FIG. 2G, the first and second materials 15B and 17 (see FIG. 2F) may be etched to form first and second contact plugs 18 and 19 in the first and second regions 100 and 200, respectively. The process of etching the first and second materials 15B and 17 may be performed through a planarization process. The planarization process may include a chemical-mechanical polishing process or etch-back process, for example. The first and second materials 15B and 17 may be etched to electrically isolate the adjacent contact holes from each other. For example, the first and second materials 15B and 17 may be etched to expose the hard mask layer 13.

In the present implementation, the hard mask layer 13 may be left in the semiconductor device. However, other implementations are also possible. For example, the first material 15A may be etched to have a lower level than the top surface of the first interlayer dielectric layer 12. Furthermore, during the etching process for the first and second materials 15B and 17, the first and second materials 15B and 17 may be etched to expose the first interlayer dielectric layer 12. The etched second material will be represented by reference numeral 17A.

Through the isolation process, the first and second contact plugs 18 and 19 having different structures (e.g., material compositions) may be formed in the first and second regions 100 and 200, respectively. The first contact plug 18 may include the first and second materials 15A and 17A. The first contact plug 18 may include a stacked structure of the first material 15A and the second material 17. The second contact plug 19 may include a single-layer structure of the first material 15B.

Figure 2H:
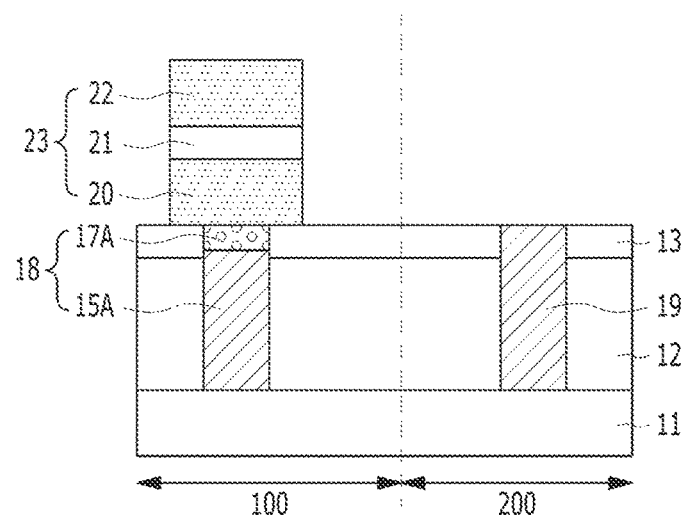

As illustrated in FIG. 2H, a variable resistance element 23 may be formed over the hard mask layer 13 of the first region 100 so as to be in contact with the first contact plug 18. The variable resistance element 23 may include a stacked structure of a first magnetic layer 20, a tunnel barrier layer 21, and a second magnetic layer 22. Furthermore, a spacer (not illustrated) may be formed on the sidewalls of the variable resistance element 23. The variable resistance element 23 may further include a first electrode (not illustrated) under the first magnetic layer, a second electrode (not illustrated) over the second magnetic layer. Further, the variable resistance element 23 may include additional layers for improving the characteristics of the magnetic layers, for example, a template layer, a coupling layer, and an interface layer.

In order to form the variable resistance element 23, the first magnetic layer 20, the tunnel barrier layer 21, and the second magnetic layer 22 may be sequentially deposited over the hard mask layer 13, and then patterned. At this time, as the second contact plug 19 of the second region is exposed, the exposed portion may be damaged and residues may cover the surface of the hard mask layer 13. Such residues may cause a short fail during a subsequent process. In the present implementation, however, the first and second contact plugs 18 and 19 may be formed to have different structures such as their material compositions. In particular, the first material 15B forming the second contact plug 19 may be formed of or include a material which is more easily oxidized than the second material 17A, and converted into an insulating material in reaction to oxygen. Thus, the first material 15B may reliably prevent a short fail caused by residues.

Figure 2I:
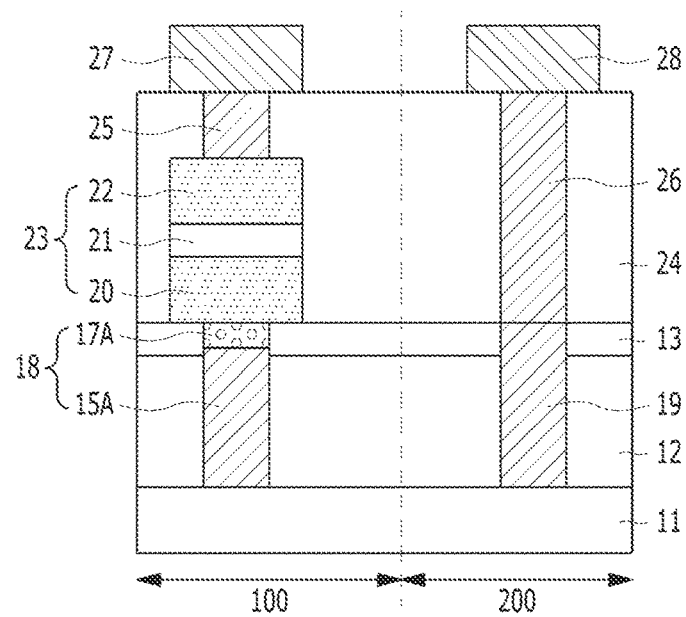

As illustrated in FIG. 2I, a second interlayer dielectric layer 24 may be formed over the hard mask layer 13. The second interlayer dielectric layer 24 may be formed to such a sufficient thickness as to fill the space between the variable resistance elements 23. For example, the second interlayer dielectric layer 24 may be formed to have a higher level than the top surface of the variable resistance element 23. The second interlayer dielectric layer 24 may be formed of the same material as the first interlayer dielectric layer 12. The second interlayer dielectric layer 24 may include oxide, nitride, or oxynitride, for example. The second interlayer dielectric layer 24 may include a single-layer or multilayer structure.

Then, a third contact plug 25 may be formed to be coupled to the variable resistance element 23 through the second interlayer dielectric layer 24 of the first region 100. The third contact plug 25 may be formed through the following series of processes: a contact hole is formed to expose the top surface of the variable resistance element 23 through a part of the second interlayer dielectric layer 24, a conductive material is formed to gap-fill the contact hole, and an isolation process is performed to electrically isolate the third contact plugs 25 from adjacent third contact plugs. Thus, the third contact plug 25 may electrically couple the conductive line 27 to the variable resistance element 23. In some implementations, the third contact plug 25 may also serve as an electrode for the variable resistance element 23, for example, a top electrode contact (TEC).

Then, a fourth contact plug 26 may be formed to be in contact with the second contact plug 19 through the second interlayer dielectric layer 24 of the second region 200. The fourth contact plug 26 may be formed through the following series of processes: a contact hole is formed to expose the second contact plug 19 through the second interlayer dielectric layer 24, a conductive material is formed to gap-fill the contact hole, and an isolation process is performed to electrically isolate the fourth contact plugs 26 from adjacent fourth contact plugs.

Then, a conductive line 27 may be formed to be coupled to the third contact plug 25 of the first region 100, and a metal wiring 28 may be formed to be coupled to the fourth contact plug 26 of the second region 200. The conductive line 27 and the metal wiring 28 may include a stacked structure of a barrier layer and a metallic layer.

FIG. 2I illustrates that the conductive line 27 and the metal wiring 28 are formed on the same line. However, other implementations are also possible. For example, the conductive line 27 and the metal wiring 28 may be formed at different levels to have a level difference depending on the process. In some implementations, after the conductive line 27 is formed, the fourth contact plug 26 and the metal wiring 28 may be formed.

In accordance with the implementations, the electronic device including the semiconductor memory and the method for fabricating the same can improve the characteristic of the variable resistance element.

The above and other memory circuits or semiconductor devices based on the disclosed technology can be used in a range of devices or systems. FIGS. 3-7 provide some examples of devices or systems that can implement the memory circuits disclosed herein.

Figure 3:
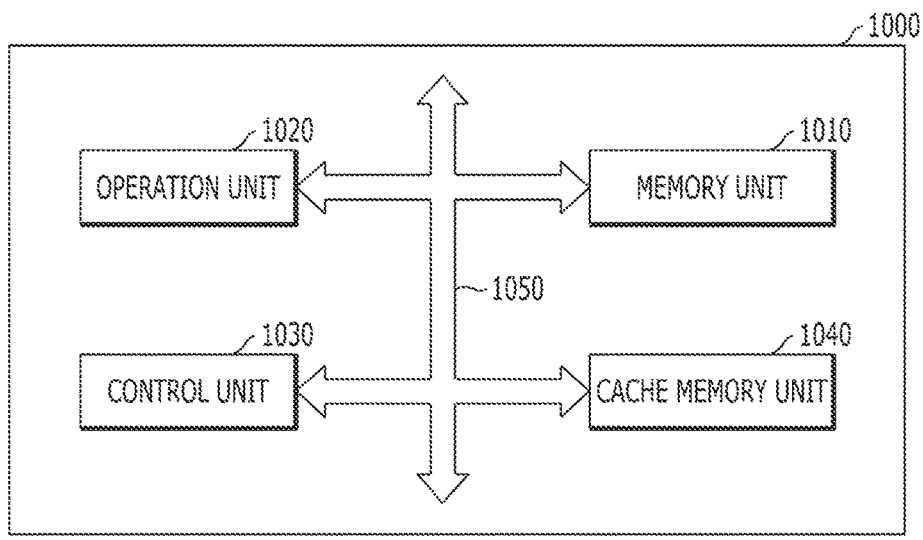
FIG. 3 is an example of configuration diagram of a microprocessor implementing memory circuitry based on the disclosed technology.

FIG. 3 is an example of configuration diagram of a microprocessor implementing memory circuitry based on the disclosed technology.

Referring to FIG. 3, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the memory unit 1010 may become easy and the reliability and yield of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 4:
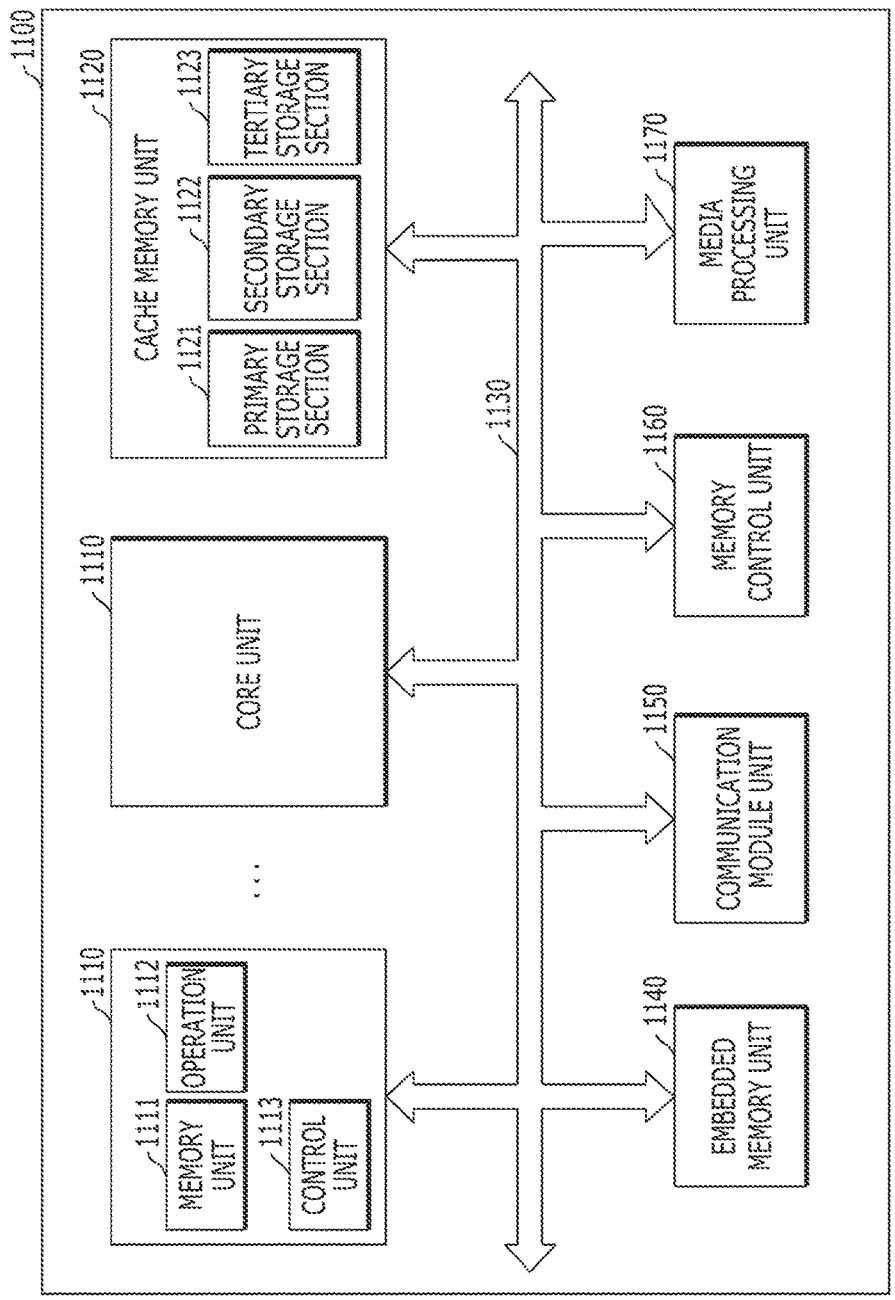
FIG. 4 is an example of configuration diagram of a processor implementing memory circuitry based on the disclosed technology.

FIG. 4 is an example of configuration diagram of a processor implementing memory circuitry based on the disclosed technology.

Referring to FIG. 4, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the cache memory unit 1120 may become easy and the reliability and yield of the cache memory unit 1120 may be improved. As a consequence, operating characteristics of the processor 1100 may be improved.

Although it was shown in FIG. 4 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 5:
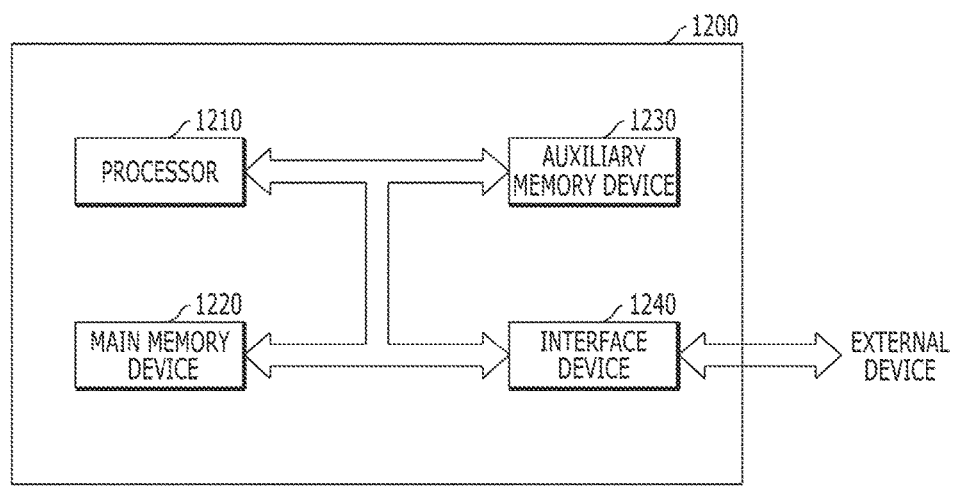
FIG. 5 is an example of configuration diagram of a system implementing memory circuitry based on the disclosed technology.

FIG. 5 is an example of configuration diagram of a system implementing memory circuitry based on the disclosed technology.

Referring to FIG. 5, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the main memory device 1220 may become easy and the reliability and yield of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the auxiliary memory device 1230 may become easy and the reliability and yield of the auxiliary memory device 1230 may be improved. As a consequence, operating characteristics of the system 1200 may be improved.

Also, the auxiliary memory device 1230 may further include a data storage system (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 6) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 6:
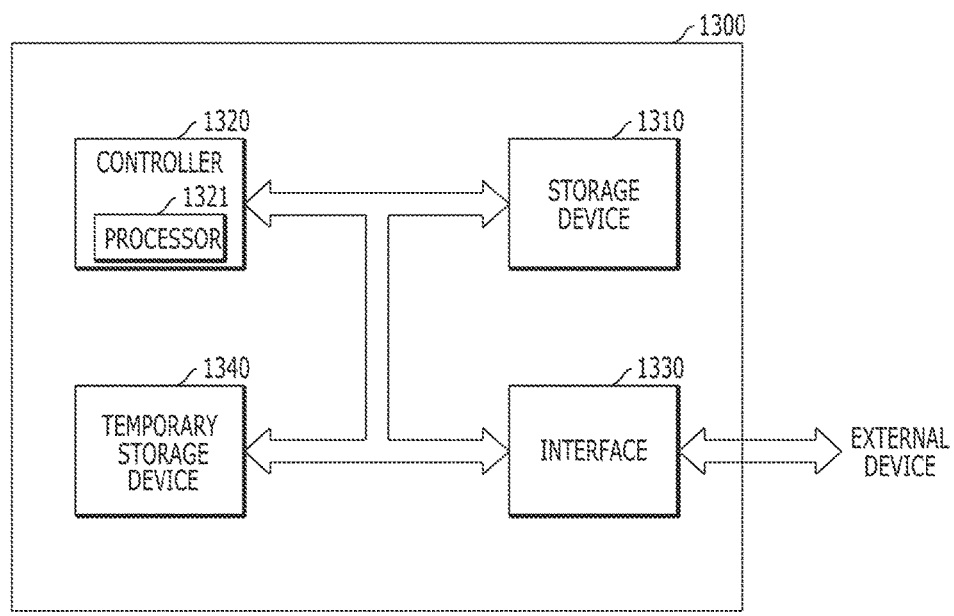
FIG. 6 is an example of configuration diagram of a data storage system implementing memory circuitry based on the disclosed technology.

FIG. 6 is an example of configuration diagram of a data storage system implementing memory circuitry based on the disclosed technology.

Referring to FIG. 6, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the storage device 1310 or the temporary storage device 1340 may become easy and the reliability and yield of the storage device 1310 or the temporary storage device 1340 may be improved. As a consequence, operating characteristics and data storage characteristics of the data storage system 1300 may be improved.

Figure 7:
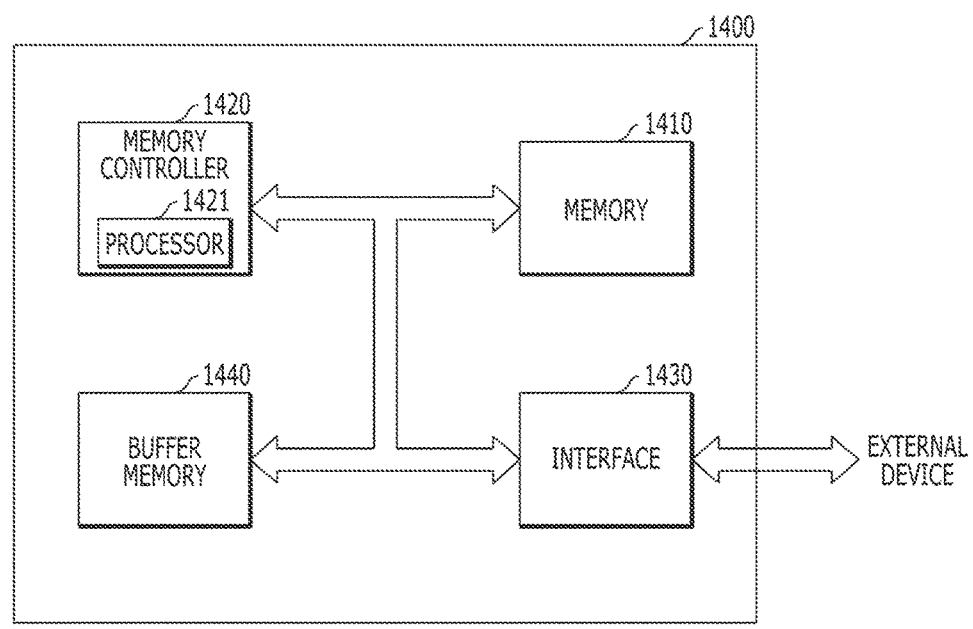
FIG. 7 is an example of configuration diagram of a memory system implementing memory circuitry based on the disclosed technology.

FIG. 7 is an example of configuration diagram of a memory system implementing memory circuitry based on the disclosed technology.

Referring to FIG. 7, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the memory 1410 may become easy and the reliability and yield of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic. The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include an interlayer dielectric layer formed over a substrate including first and second regions; first and second contact plugs formed through the interlayer dielectric layer and having different structures in the first and second regions, respectively; and a variable resistance element formed over the interlayer dielectric layer of the first region so as to be in contact with the first contact plug. Through this, a fabrication process of the buffer memory 1440 may become easy and the reliability and yield of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 3-7 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory,
   wherein the semiconductor memory comprises:
   a substrate including a first region and a second region separated from the first region;
   an interlayer dielectric layer formed over the substrate;
   a first contact plug located over the first region of the substrate and formed through the interlayer dielectric layer;
   a second contact plug located over the second region of the substrate and formed through the interlayer dielectric layer, wherein the first and the second contact plugs have different structures from each other and
   a variable resistance element formed over the interlayer dielectric layer over the first region of the substrate so as to be in contact with the first contact plug,
   wherein the variable resistance element and the first contact plug overlap each other,
   wherein the first contact plug includes a first material and a second material stacked over the first material,
   wherein the first material comprises a material which is more easily oxidized than the second material, wherein the second material has lower specific resistance than the first material, wherein the second contact plug includes the first material included in the first contact plug.

2. The electronic device of claim 1, wherein the first and second materials are different from each other, and the second contact plug has a material composition that is different from the first contact plug and includes the first material.

3. The electronic device of claim 2, wherein each of the first and second materials includes a conductive material.

4. The electronic device of claim 2, wherein each of the first and second materials includes a metallic material.

5. The electronic device of claim 2, wherein the first material comprises a titanium material, and the second material comprises a tantalum material.

6. The electronic device of claim 1, further comprising a conductive line formed over the variable resistance element of the first region of the substrate and a third contact plug formed to couple the conductive line and the variable resistance element.

7. The electronic device of claim 1, further comprising a metal wiring formed over the second contact of the second region of the substrate and a fourth contact plug formed to couple the metal wiring and the second contact plug.

8. The electronic device according to claim 1, further comprising a microprocessor which includes:
a control unit configured to receive a signal including a command from an outside of the microprocessor, and performs extracting, decoding of the command, or controlling input or output of a signal of the microprocessor;
an operation unit configured to perform an operation based on a result that the control unit decodes the command; and
a memory unit configured to store data for performing the operation, data corresponding to a result of performing the operation, or an address of data for which the operation is performed,
wherein the semiconductor memory unit that includes the resistance variable element is part of the memory unit in the microprocessor.

9. The electronic device according to claim 1, further comprising a processor which includes:
a core unit configured to perform, based on a command inputted from an outside of the processor, an operation corresponding to the command, by using data;
a cache memory unit configured to store data for performing the operation, data corresponding to a result of performing the operation, or an address of data for which the operation is performed; and
a bus interface connected between the core unit and the cache memory unit, and configured to transmit data between the core unit and the cache memory unit,
wherein the semiconductor memory unit that includes the resistance variable element is part of the cache memory unit in the processor.

10. The electronic device according to claim 1, further comprising a processing system which includes:
a processor configured to decode a command received by the processor and control an operation for information based on a result of decoding the command;
an auxiliary memory device configured to store a program for decoding the command and the information;
a main memory device configured to call and store the program and the information from the auxiliary memory device such that the processor can perform the operation using the program and the information when executing the program; and
an interface device configured to perform communication between at least one of the processor, the auxiliary memory device and the main memory device and the outside,
wherein the semiconductor memory unit that includes the resistance variable element is part of the auxiliary memory device or the main memory device in the processing system.

11. The electronic device according to claim 1, further comprising a data storage system which includes:
a storage device configured to store data and conserve stored data regardless of power supply;
a controller configured to control input and output of data to and from the storage device according to a command inputted form an outside;
a temporary storage device configured to temporarily store data exchanged between the storage device and the outside; and
an interface configured to perform communication between at least one of the storage device, the controller and the temporary storage device and the outside,
wherein the semiconductor memory unit that includes the resistance variable element is part of the storage device or the temporary storage device in the data storage system.

12. The electronic device according to claim 1, further comprising a memory system which includes:
a memory configured to store data and conserve stored data regardless of power supply;
a memory controller configured to control input and output of data to and from the memory according to a command inputted form an outside;
a buffer memory configured to buffer data exchanged between the memory and the outside; and
an interface configured to perform communication between at least one of the memory, the memory controller and the buffer memory and the outside,
wherein the semiconductor memory unit that includes the resistance variable element is part of the memory or the buffer memory in the memory system.

13. The electronic device of claim 1, wherein top surfaces of the first and second contact plugs have a same level in a horizontal direction.

14. An electronic device comprising a semiconductor memory including a plurality of unit cells,
wherein each unit cell of the semiconductor memory comprises:
a substrate including a first region and a second region that are separated from each other;
a first contact plug located over the first region and having a stack structure including a first material and a second material different from the first material;
a second contact plug located over the second region and including the first material, wherein the first material is more easily oxidized than the second material;
a variable resistance element formed over the first contact plug to be in contact with the second material of the first contact plug, the variable resistance element structured to have different resistance states for storing information;
a third contact plug formed over the variable resistance element to provide an electrical path to a conductive line; and a fourth contact plug formed over the second contact plug to be in contact with the second contact plug and including the same material as the second contact plug to reduce an interfacial resistance between the second and the fourth contact plugs.

15. The electronic device of claim 14, wherein the first material has an insulation property when reacted to oxygen.

16. The electronic device of claim 14, wherein the second material has lower specific resistance than the first material.

* * * * *